United States Patent
Eilert et al.

(10) Patent No.: US 7,567,471 B2
(45) Date of Patent: Jul. 28, 2009

(54) HIGH SPEED FANNED OUT SYSTEM ARCHITECTURE AND INPUT/OUTPUT CIRCUITS FOR NON-VOLATILE MEMORY

(75) Inventors: Sean S. Eilert, Penryn, CA (US); Rodney R. Rozman, Placerville, CA (US); Shekoufeh Qawami, El Dorado Hills, CA (US); Glenn Hinton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 11/645,043

(22) Filed: Dec. 21, 2006

(65) Prior Publication Data

US 2008/0151648 A1 Jun. 26, 2008

(51) Int. Cl.
*G11C 7/00* (2006.01)

(52) U.S. Cl. ............... 365/189.12; 365/189.011; 365/189.02; 365/189.04; 365/239; 365/240; 710/3; 710/4; 710/305; 711/154

(58) Field of Classification Search ............ 365/189.12, 365/189.011, 189.02, 189.04, 239, 240; 710/3, 710/4, 305; 711/154
See application file for complete search history.

(56) References Cited

U.S. PATENT DOCUMENTS

| | | | | |
|---|---|---|---|---|
| 4,914,630 A | * | 4/1990 | Fujishima et al. | ...... 365/189.04 |
| 4,969,126 A | * | 11/1990 | Maeno | ............ 365/240 |
| 5,341,335 A | * | 8/1994 | Young et al. | ............ 365/221 |
| 6,385,688 B1 | | 5/2002 | Mills et al. | |
| 6,401,161 B1 | | 6/2002 | Nolan et al. | |
| 2003/0191891 A1 | | 10/2003 | Tanaka et al. | |
| 2005/0073899 A1 | | 4/2005 | Gallivan et al. | |
| 2005/0122794 A1 | * | 6/2005 | Chard et al. | ........ 365/189.12 |
| 2006/0129701 A1 | | 6/2006 | Qawami et al. | |

OTHER PUBLICATIONS

Korean Patent Office, International Search Report and Written Opinion for International Application No. PCT/US2007/087806, 8 pgs., Apr. 4, 2008.

* cited by examiner

*Primary Examiner*—Anh Phung
*Assistant Examiner*—Eric Wendler
(74) *Attorney, Agent, or Firm*—Trop, Pruner & Hu, P.C.

(57) ABSTRACT

In various embodiments, a plurality of non-volatile memory devices, such as NAND flash memory device, may be connected to a host controller device in a fanned out configuration that allows each of the plurality of memory devices to perform read and/or write operations simultaneously. Each non-volatile memory device may include high speed input circuitry and high speed output circuitry so that transfers to and from memory are not limited by the speed of the flash memory read/write interface.

17 Claims, 4 Drawing Sheets

HIGH SPEED FANNED OUT SYSTEM ARCHITECTURE AND INPUT/OUTPUT CIRCUITS FOR NON-VOLATILE MEMORY

BACKGROUND

NAND flash memory devices are typically used to store data that is to be read out in large blocks, such as digitized images, sound, or video. Conventional NAND memories provide bandwidth across x8 or x16 interfaces in the range of tens of megabytes per second. Typical NAND array architectures can support similar array-to-page buffer bandwidth. With this relatively good match between the array bandwidth and the interface bandwidth, data rates to the host are relatively well optimized when a single NAND device is instantiated in the system. However, when multiple NAND devices share an interface to the host, the interface becomes a bottleneck.

BRIEF DESCRIPTION OF THE DRAWINGS

A better understanding of embodiments of the present invention can be obtained from the following detailed description in conjunction with the following drawings, in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention as hereinafter claimed. For example, although some embodiments are described with respect to flash memory devices, and in particular, NAND flash memory device, embodiments may also be applicable to other types of memory, including, but not limited to, NOR flash memory devices and bit alterable memories, such as phase change memory. Also, although specific memory sizes are mentioned herein, it should be understood that these are examples for the purpose of illustration only, and that larger or smaller memory sizes, buffer sizes, bus or interconnect widths, etc., may also be used in other embodiments.

In the following description and claims, the terms "include" and "comprise," along with their derivatives, may be used, and are intended to be treated as synonyms for each other. In addition, in the following description and claims, the terms "coupled" and "connected," along with their derivatives may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

Figure 1:
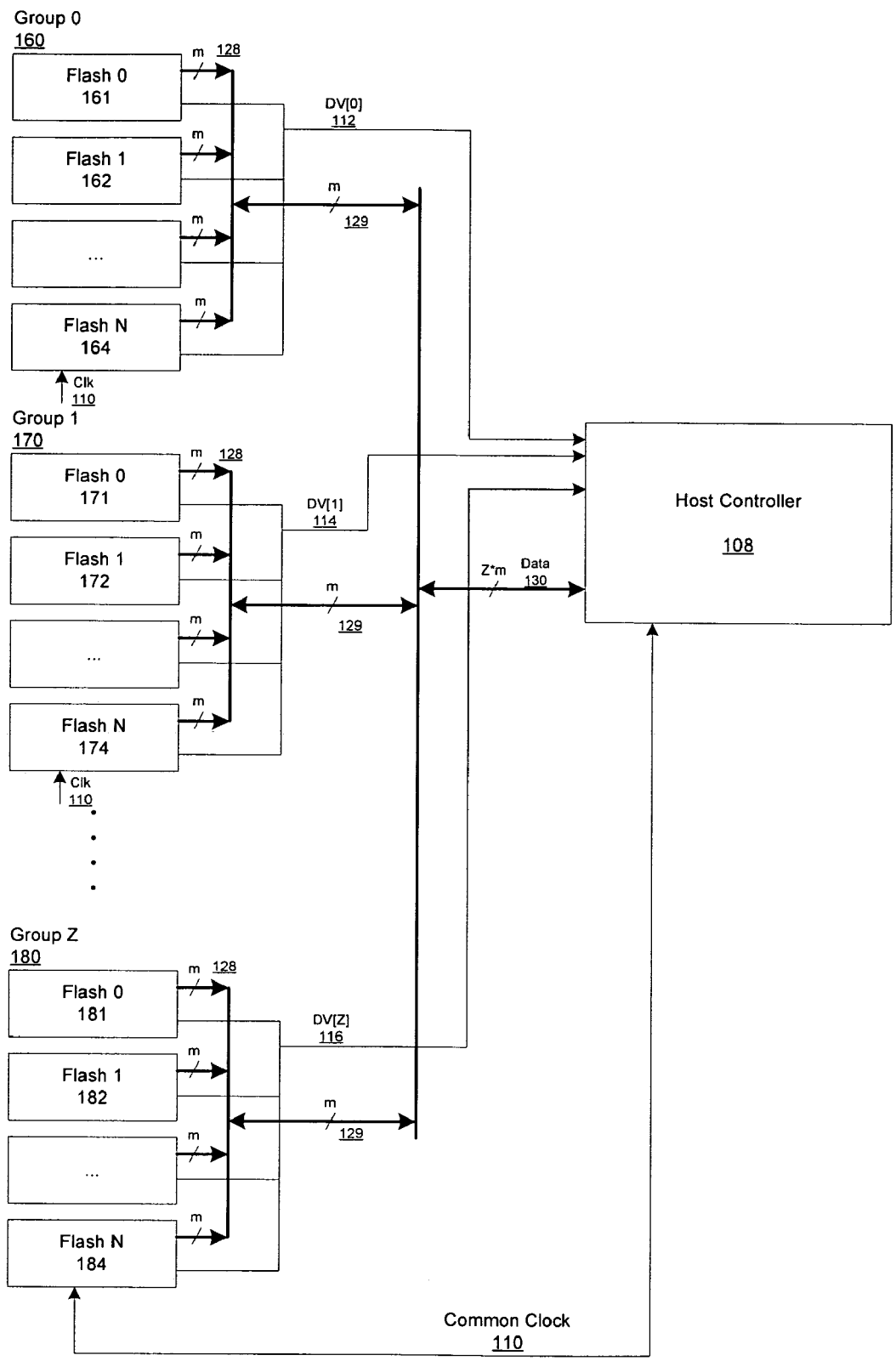
FIG. 1 is an illustration of a memory/host controller interface according to some embodiments.

FIG. 1 illustrates a memory/host controller interface according to some embodiments. A plurality of groups of memory devices (160,170,180) are coupled to a host controller (108) via a bus or interconnect (130). Each group of memory devices (160,170,180) may include a plurality of memory devices, 161-164, 171-174, and 181-184, respectively, in a fanned out configuration.

In some embodiments, the number of groups of memory devices, Z, may be equal to 4, however, there may be more or fewer groups in other embodiments. The frequency of the interface may be determined largely by the number of groups, Z, due to the capacitance added by each additional device sharing the data signals. Thus, the number of groups, Z, may be limited by system design requirements, including, but not limited to interface frequency and/or data line capacitance.

In some embodiments, the number of memory devices in each group may be equal to four, however, there may be more or fewer devices in each group in other embodiments. In some embodiments, each of the memory devices is a nonvolatile memory device, such as a NAND flash memory device.

Each memory device may have an m-bit wide data interface (128). Data from all flash devices in a group (e.g. 161-164) may be time multiplexed on an m-bit interconnect (129). In this manner, pin bandwidth may be optimized at the memory device. In some embodiments, m may be equal to 1, 2, 4, 8, 16, or any other feasible number of bits. This number may be determined based on the design of the host controller or may be cost limited.

The host controller device (108) may have a data interface (130) that is Z*m bits wide, where Z is equal to the number of groups of memory devices and m is equal to the width, in bits, of the data interface on each flash memory device in the group.

The host controller (108) or another device (not shown) in the system may generate a clock signal (110) to be provided to each memory device in the system. The clock signal may be used to eliminate the need for independent clock generation by the memory devices.

To facilitate synchronization between the buffers on the host controller and the buffers on the memory devices, a data valid (DV) signal (112, 114, 116) may be provided between each group of devices (160, 170, 180) and the host controller (108). Thus, the interface between the flash memory devices and the host controller may be an asynchronous interface in some embodiments. Delay chains may be added to the data (130) or data valid (112, 114, 116) signals on the receiving end of the interface to ensure that setup and hold timings are met for input latches. The data valid signals (112, 114, 116) and data signals (130) may be synchronized so that data at the receiving end of the interface is latched with appropriate timings.

When utilizing a fanned out memory interface, such as that illustrated in FIG. 1, array operations may occur in parallel across all memory devices in the system. For example, each device in the memory bank (161-164, 171-174, 181-184) may be performing an array read operation at the same time, or may be performing an array write operation at the same time. Furthermore, some devices may be performing an array read operation, while other devices are simultaneously performing an array write operation.

The memory interface of FIG. 1 may also be capable of supporting individual device mode commands and broadcast commands affecting all devices.

Each memory device may include one or more configuration registers, to configure the device for use in a fanned out configuration. The configuration register(s) may be integrated into a logic block within the flash memory device, such as a shift register control logic block, or may be independent from the shift register control logic. Additionally, the host controller (108) may include a configuration register that may be used to simultaneously configure all of the memories' registers.

Figure 2A:
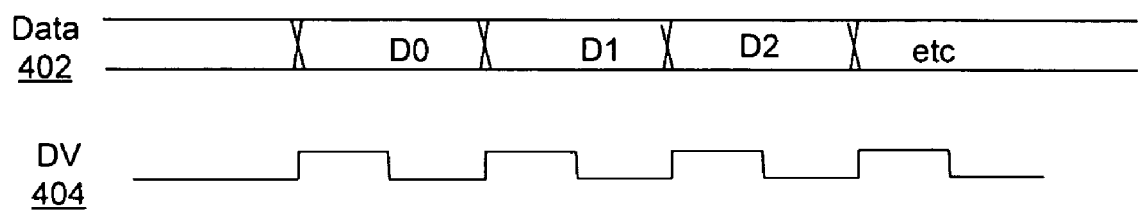
FIGS. 2A and 2B are timing diagrams according to some embodiments.
Figure 2B:
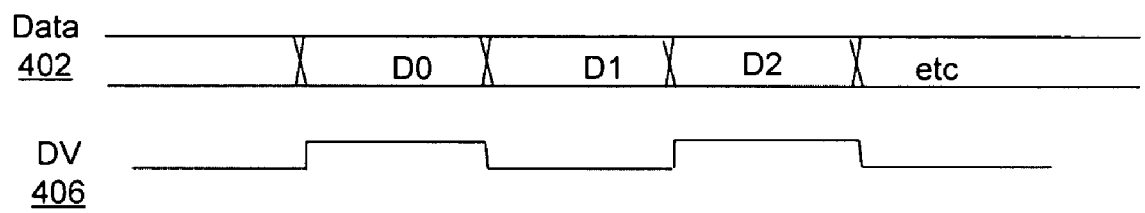

FIGS. 2A and 2B illustrate the relationship between the data signals and the data valid signal for reads and writes to and from memory. In some embodiments, data may be latched on only the rising edge of the data valid signal. In other embodiments, data may be latched on both the rising and falling edges of the data valid signal. In yet other embodiments, data may be latched on a rising and/or falling edge of a clock signal. In yet other embodiments, data may be latched based on a combination of the data valid and clock signals. For example, data may be latched on the rising and/or falling edge of the clock signal only when the data valid signal is asserted.

FIG. 2A is a timing diagram for single data edge reads and writes. The data (402) is latched on the rising edge only of the data valid signal (404). In other embodiments, the data (402) may be latched on the falling edge only of the data valid signal (404).

FIG. 2B is a timing diagram for dual data edge reads and writes. Here, the data (402) is latched on both the rising and the falling edges of the data valid signal (406).

In some embodiments, the memory devices of FIG. 1 may include high speed input and output circuitry. The high speed input and output circuitry may allow the memory device to input and output data at a higher data rate than the memory device's internal read/write circuitry permits.

Figure 3:
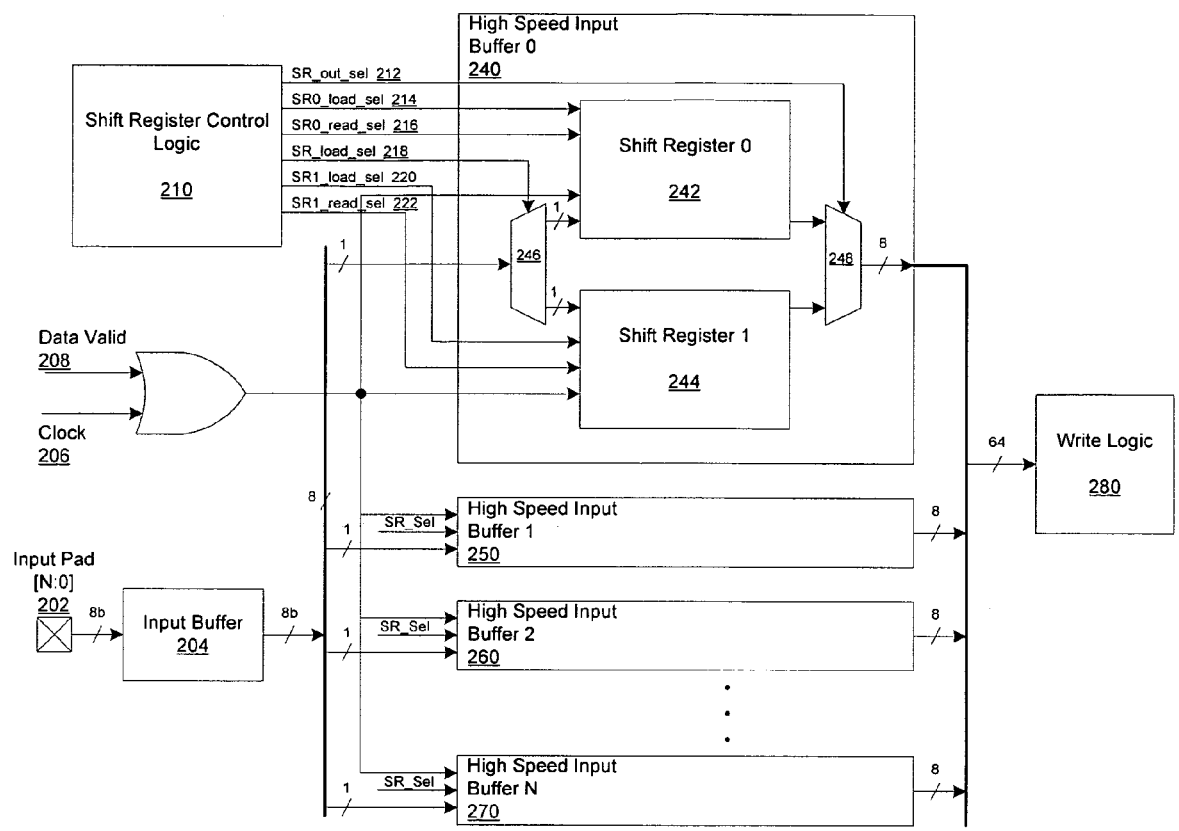
FIG. 3 is an illustration of a high speed input path according to some embodiments.

FIG. 3 illustrates a high speed input path for a memory device according to some embodiments. The memory device may be a NAND flash memory device, or may be another non-volatile memory device.

Data is input to the memory device at an input pad (202) and an input buffer (204). The data may then be transferred from the input buffer (204) to one of a plurality of high speed input buffers (240, 250, 260, 270).

Each high speed input buffer (240, 250, 260, 270) includes a demultiplexer (246) and a multiplexer (248), and at least two shift registers (242, 244) arranged in parallel. Inputs to the high speed input buffer may include a shift register output select signal (212) and a shift register load select signal (218), as well as shift register 0 load select (214) and read select (216) signals and shift register 1 load select (220) and read select (222) signals. These signals may all be generated by shift register control logic (210), and may operate to configure the first and the second shift register to receive or to transmit data. A data valid signal (208) or a clock signal (206) may also be input to the high speed input buffer.

At any given time, the first shift register (242) may be loading data from the input buffer (204) at a high rate of speed while the second shift register (244) is transferring data to internal write logic circuitry (280) at a lower rate of speed. The data transferred to the write logic (280) will subsequently be written to the memory array.

The shift register control logic (210) determines which shift register is loading data from the input buffer, and which is transferring data to write logic by generating the appropriate shift register select signals (SR_Sel) (212, 214, 216, 218, 220, 222) to configure the shift registers, as described above. When each shift register has completed its respective load or transfer operation, the operations are swapped by the shift register control logic (210), and the first shift register (242) then transfers its loaded data to the write logic (280) while the second shift register (244) is loaded with data from the input buffer (204). By toggling shift registers in this manner until a NAND write operation is complete, the high speed interface between the host controller and the memory device is not limited by the relatively slow write operations to the NAND flash memory array. In some embodiments, data may be received at the input pad at rates of greater than 400 MHz, while data may be written to the memory array at approximately 40 MHz.

In some embodiments, the shift registers (242, 244) may be 128-bit shift registers. In other embodiments, the shift registers may be 64-bit shift registers. In yet other embodiments, other size shift registers may be used.

The data valid (208) or clock (206) signals are used to latch data into the shift registers at the appropriate time.

A plurality of high speed input buffers (240, 250, 260, 270) may operate in parallel to provide data to the write logic to be written to a NAND memory array. In one embodiment, a NAND memory device may include eight high speed input buffers, to provide 64 bits of data to the write logic, however in other embodiments, more or less than eight high speed input buffers may be used.

Figure 4:
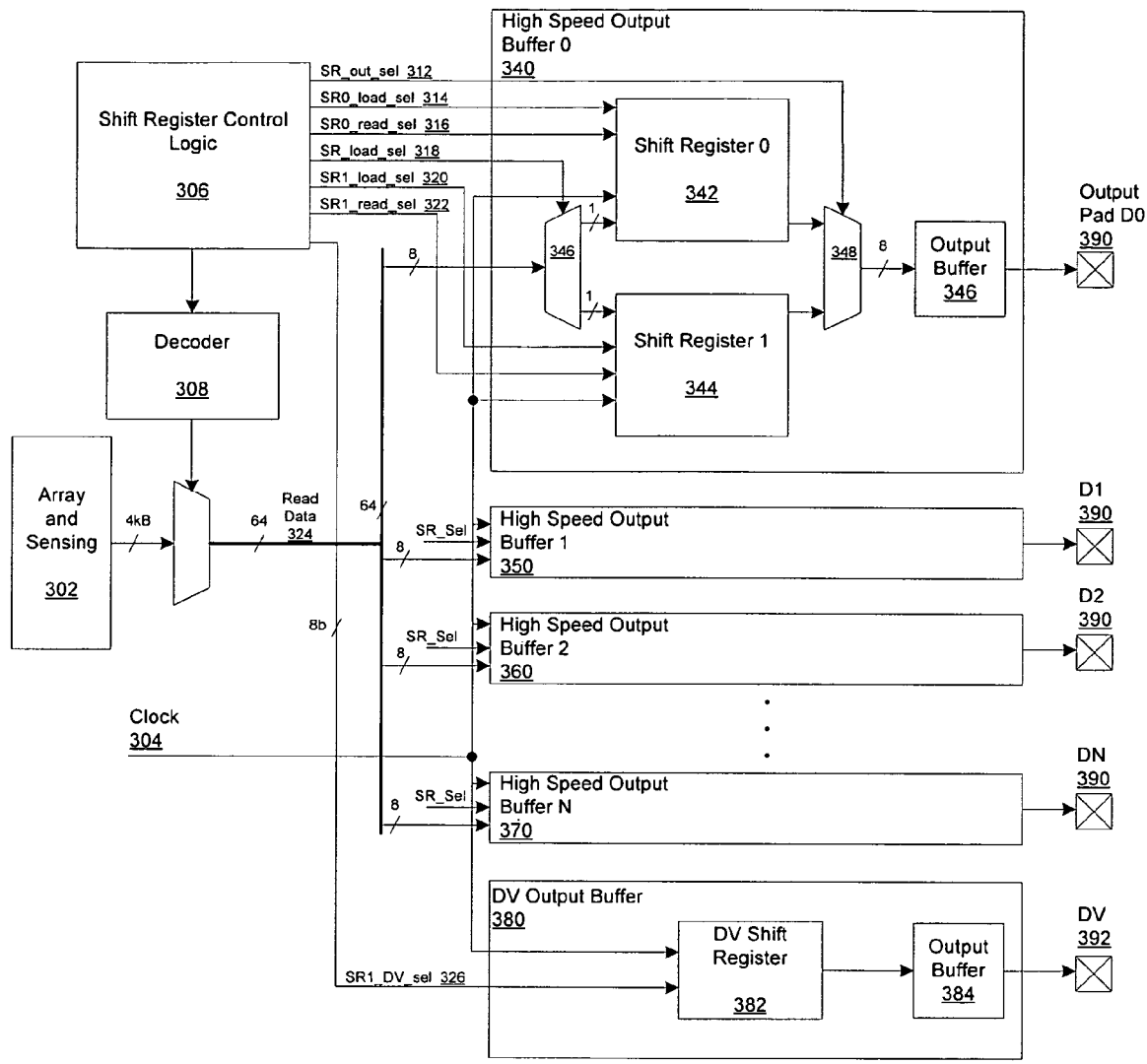
FIG. 4 is an illustration of a high speed output path according to some embodiments.

FIG. 4 illustrates a high speed output path according to some embodiments. The high speed output path operates in a similar manner to the high speed input path described above with respect to FIG. 3.

When a read command is issued, 4 kB (or more) of data is read from the array by sensing logic (302). A 4 kB to x bit decoder (308) may be used to read the sensed data x bits at a time (324). In some embodiments, x may be equal to 64, 128, or another number of bits. The data may then be loaded into a high speed output buffer (340, 350, 360, 370).

Each high speed output buffer (340, 350, 360, 370) includes a demultiplexer (346) and a multiplexer (348), and at least two shift registers (342, 344) arranged in parallel. Inputs to the high speed input buffer may include a shift register output select signal (312) and a shift register load select signal (318), as well as shift register 0 load select (314) and read select (316) signals and shift register 1 load select (320) and read select (322) signals. These signals may all be generated by shift register control logic (306). A clock signal (304) may also be input to the high speed input buffer, and may be used to latch the data at the proper time.

At any given time, the first shift register (342) may be loading data from the array (302) at a low rate of speed while the second shift register (344) is transferring data to an output buffer (346) and output data pad (390) at a higher rate of speed. The data transferred to the output buffer (346) will subsequently be transmitted to a host controller device.

The shift register control logic (306) determines which shift register is loading data from the input buffer, and which is transferring data to write logic by generating the appropriate shift register select signals (SR_Sel) (312, 314, 316, 318, 320, 322), as described above. When each shift register has completed its respective load or transfer operation, the operations are swapped by the shift register control logic (306), and the first shift register (342) then transfers its loaded data to the output buffer (346) while the second shift register (344) is loaded with data from the array (302). By toggling shift registers in this manner until a NAND read operation is complete, the high speed interface between the host controller and the memory device is not limited by the relatively slow read operation from the NAND flash memory array. In some embodiments, data may be transmitted at the output pad (390) at rates of greater than 400 MHz, while data may be read from the memory array (302) at approximately 40 MHz.

In some embodiments, the shift registers (342, 344) may be 128-bit shift registers. In other embodiments, the shift registers may be 64-bit shift registers. In yet other embodiments, other size shift registers may be used. The size of the shift registers and the width of the data bus between the array and the shift registers may depend on a number of variables. For example, the longer the time needed to get data from the NAND array sensing to the shift register, the larger the shift register needs to be. The size of the shift register may also depend on the speed of the NAND device's I/O bus. In general, the higher the bus speed, the larger the shift register must be.

The memory device may also include a data valid output buffer (380). The data valid output buffer generates a data valid signal at the data valid pad (392). The inputs to the data valid output buffer include a clock (304) and a data valid select signal (326) generated by the shift register control logic (306). The data valid output buffer may use a shift register (382) and an output buffer (384) to generate a data valid signal. Optional delay elements (not shown) may be sued to ensure the data valid signal is output at the appropriate time. As described above, the data valid signal (392) and the data signals (390) may be synchronized so that data is latched with appropriate timings at the receiving end of the interface (e.g., the host controller).

A plurality of high speed output buffers (340, 350, 360, 370) may operate in parallel to provide data to the output pads to be transmitted to a host controller device. In one embodiment, a NAND memory device may include eight high speed output buffers.

The methods set forth above may be implemented via instructions stored on a machine-accessible medium which are executed by a processor. The instructions may be implemented in many different ways, utilizing any programming code stored on any machine-accessible medium. A machine-accessible medium includes any mechanism that provides (i.e., stores and/or transmits) information in a form readable by a machine, such as a computer. For example, a machine-accessible medium includes random-access memory (RAM), such as static RAM (SRAM) or dynamic RAM (DRAM); ROM; magnetic or optical storage medium; flash memory devices; electrical, optical, acoustical or other form of propagated signals (e.g., carrier waves, infrared signals, digital signals); etc.

Thus, a high speed fanned out system architecture and input/output circuits for non-volatile memory are disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. An apparatus comprising:
a first shift register;
a second shift register;
shift register control logic coupled to the first shift register and the second shift register, the shift register control logic to configure the first shift register to receive data from an input buffer at a first data rate and to configure the second shift register to transfer data to write logic at a second data rate, wherein the first data rate is greater than the second data rate.

2. The apparatus of claim 1, wherein the write logic is to write the data to a NAND flash memory array.

3. The apparatus of claim 1, wherein the first shift register and the second shift register are 128-bit shift registers.

4. The apparatus of claim 1, wherein the shift register control logic is further to configure the first shift register to transfer data to the write logic at the second data rate and to configure the second shift register to receive data from the input buffer at the first data rate, wherein the first data rate is greater than the second data rate.

5. The apparatus of claim 4, wherein the first data rate is greater than 40 MHz.

6. An apparatus comprising:
a first shift register;
a second shift register;
shift register control logic coupled to the first shift register and the second shift register, the shift register control logic to configure the first shift register to receive data from sensing logic at a first data rate and to configure the second shift register to transmit data to an output buffer at a second data rate, wherein the second data rate is greater than the first data rate.

7. The apparatus of claim 6, further comprising a data valid output buffer coupled to the shift register control logic, the data valid output buffer to generate a data valid signal to indicate when data transmitted from the second shift register is valid.

8. The apparatus of claim 6, wherein the shift register control logic is further to configure the first shift register to transmit data to the output buffer at the second data rate and to configure the second shift register to receive data from the sensing logic at the first data rate, wherein the second data rate is greater than the first data rate.

9. The apparatus of claim 6, wherein the first shift register and the second shift register are 128-bit shift registers.

10. The apparatus of claim 6, wherein the sensing logic is coupled to a NAND flash memory array.

11. The apparatus of claim 8, wherein the second data rate is greater than 40 MHz.

12. A method comprising:
receiving data at a first shift register at a first data rate while simultaneously transmitting data from a second shift register at a second data rate; and
transmitting data from the first shift register at the second data rate while simultaneously receiving data at the second shift register at the first data rate.

13. The method of claim 12, wherein the first data rate is greater than the second data rate.

14. The method of claim 12, wherein the second data rate is greater than the first data rate.

15. The method of claim 13, wherein receiving data comprises receiving data from an input buffer of a NAND flash memory device and wherein transmitting data comprises transmitting data to write logic in a NAND flash memory device.

16. The method of claim 14, wherein receiving data comprises receiving data from a NAND flash memory array sensing logic and wherein transmitting data comprises transmitting data to a host controller device 17. The method of claim 16, further comprising generating a data valid signal to indicate when the data transmitted at the second data rate is valid.

* * * * *